(12) United States Patent
Trivedi et al.

(10) Patent No.: US 11,670,376 B2
(45) Date of Patent: Jun. 6, 2023

(54) ERASING PARTIALLY-PROGRAMMED MEMORY UNIT

(71) Applicant: Micron Technology, Inc., Boise, ID (US)

(72) Inventors: Falgun G. Trivedi, Eagle, ID (US); Motao Cao, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 17/340,688

(22) Filed: Jun. 7, 2021

(65) Prior Publication Data

US 2022/0392540 A1     Dec. 8, 2022

(51) Int. Cl.
| | |
|---|---|
| *G11C 16/04* | (2006.01) |
| *G11C 16/16* | (2006.01) |
| *G11C 16/26* | (2006.01) |
| *G11C 16/34* | (2006.01) |
| *G11C 16/10* | (2006.01) |

(52) U.S. Cl.
CPC ............ *G11C 16/16* (2013.01); *G11C 16/105* (2013.01); *G11C 16/26* (2013.01); *G11C 16/349* (2013.01)

(58) Field of Classification Search
CPC .............................. G11C 16/16; G11C 16/349
See application file for complete search history.

(56) References Cited

U.S. PATENT DOCUMENTS

| | | | |
|---|---|---|---|
| 9,286,990 B1 * | 3/2016 | Lee ..................... | G11C 16/10 |
| 2014/0003147 A1 * | 1/2014 | Dutta .................. | G11C 11/5635 |
| | | | 365/185.11 |
| 2014/0269069 A1 * | 9/2014 | D'Abreu ............... | G11C 16/06 |
| | | | 365/185.11 |
| 2019/0079859 A1 * | 3/2019 | Li ...................... | G11C 16/3495 |
| 2020/0133496 A1 * | 4/2020 | Kitsunai ............. | G06F 12/0246 |

* cited by examiner

*Primary Examiner* — Uyen Smet
(74) *Attorney, Agent, or Firm* — Schwegman Lundberg & Woessner, P.A.

(57) ABSTRACT

Various embodiments provide for erasing of one or more partially-programmed memory units of a memory device. In particular, various embodiments provide for monitoring (e.g., tracking) of partial program/erase cycles for a memory unit (e.g., block) of a memory device, and performing an erasure of the memory unit based on the monitoring.

20 Claims, 8 Drawing Sheets

US 11,670,376 B2

ERASING PARTIALLY-PROGRAMMED MEMORY UNIT

TECHNICAL FIELD

Embodiments of the disclosure relate generally to memory devices and, more specifically, to erase a partially-programmed memory unit (e.g., block), which can be performed by a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
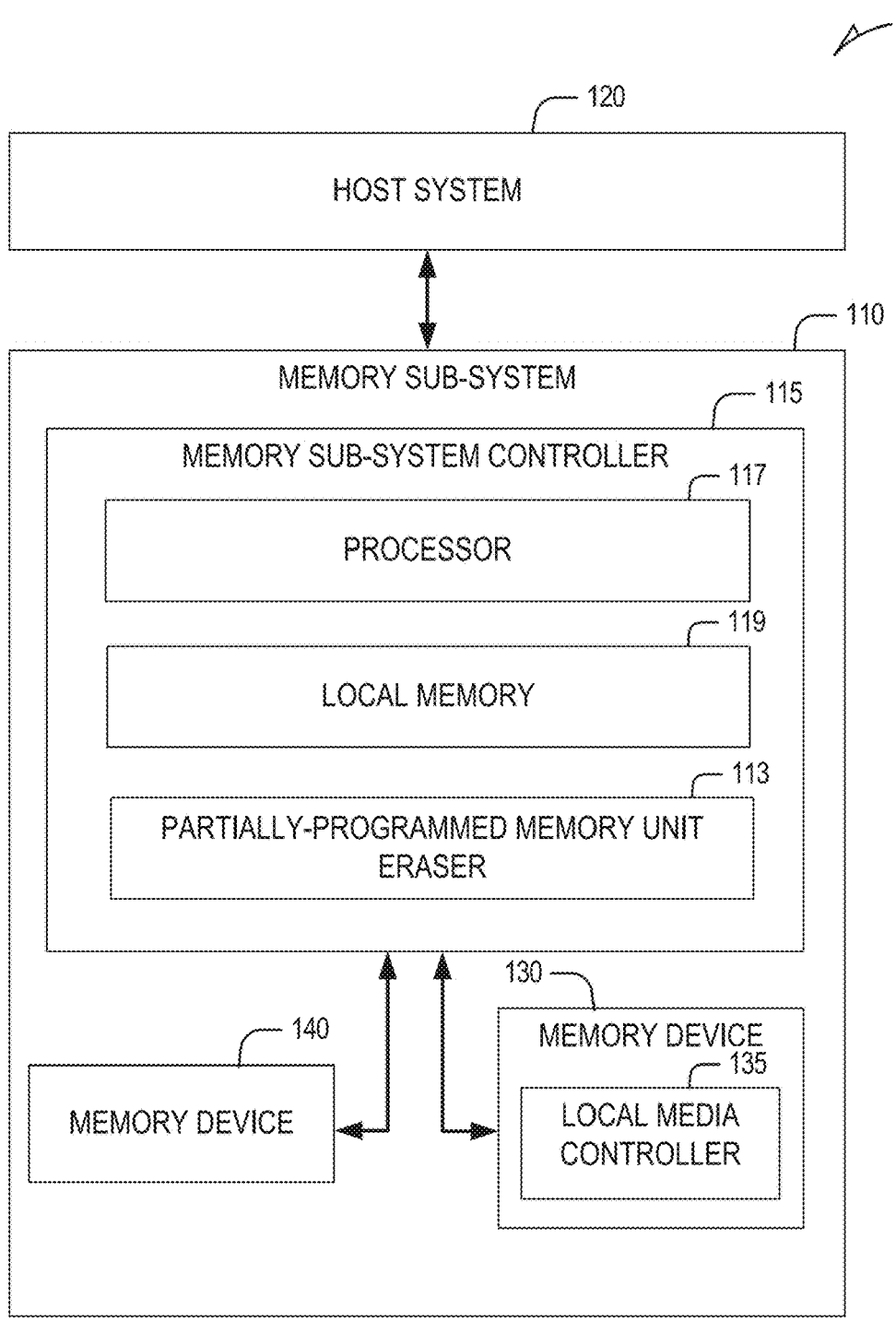
FIG. 1 is a block diagram illustrating an example computing system that includes a memory sub-system, in accordance with some embodiments of the present disclosure.

Aspects of the present disclosure are directed to erasing one or more partially-programmed memory units (e.g., blocks), which can be performed by a memory sub-system. In particular, some embodiments described herein can monitor one or more memory units (e.g., blocks) for partial programming, and erase one or more of those memory units based on the monitoring. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error-correcting code (ECC) codeword, parity code), data version (e.g., used to distinguish age of data written), valid bitmap (which LBAs or logical transfer units contain valid data), and so forth.

The memory sub-system can initiate media management operations, such as a write operation, on host data that is stored on a memory device. For example, firmware of the memory sub-system may re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical memory address mapping table, also referred to herein as a L2P table), data from logging, scratch pad data, and so forth.

A memory device can be a non-volatile memory device. A non-volatile memory device is a package of one or more die. Each die can be comprised of one or more planes. For some types of non-volatile memory devices (e.g., negative-and (NAND)-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package.

As noted herein, certain memory devices, such as NAND-type memory devices, comprise multiple blocks with each of those blocks comprising multiple pages (also referred as wordlines). Generally, writing data to such memory devices involves programming the memory devices at the page level of a block, and erasing data from such memory devices involves erasing the memory devices at the block level (i.e., page level erasure of data is not possible). As a result, use of such memory devices often can result in a cycle where a given block is programmed (at the page level) and then entirely erased before all the pages of the given block have been programmed (e.g., written with data). Such a cycle is referred to herein as a partial block program and erase cycle (or a partial program/erase cycle). In certain use cases/hardware applications, such as where small amounts of data are written to a block repeatedly or where data is written to separate blocks to increase performance through parallelism, one or more blocks of a memory device can experience numerous, back-to-back partial program/erase cycles. Unfortunately, numerous, back-to-back partial program/erase cycles can result in permanent degradation of data retention by memory devices. In particular, unprogrammed pages or wordlines (WL) of a block that are continuously erased (prior to being programmed) can experience faster charge loss when they are eventually programmed with data. The faster charge loss of pages (due to the history of partial program/erase cycles on blocks) can degrade performance of a memory device by increasing trigger rate (e.g., representing a probability of entering an error handling sequence) or causing data loss. Additionally, data retention is a major reliability limiting metric for memory devices, especially replacement gate (RG) NAND-type memory devices.

Aspects of the present disclosure address the above and other deficiencies by monitoring (e.g., tracking) partial program/erase cycles for a memory unit (e.g., block) of a memory device, and performing an erasure of the memory unit (e.g., in response to an erase request) based on the monitoring. In particular, various embodiments track whether a memory unit is partially programmed (e.g., block has at least some unprogrammed pages) prior to an erase being performed on the memory unit. In response to a partially-programmed memory unit being erased, an indicator (e.g., flag) can be set for the memory unit and an erase counter (that maintains a count of partial program/erase cycles) can be updated (e.g., incremented). Eventually, if the erase counter of a memory unit satisfies a condition (e.g., the erase counter surpasses a threshold value), an embodiment can program any unprogrammed portion of the memory unit (e.g., unprogrammed pages or open wordlines of a block) with dummy data and then erase the memory unit or, alternatively, defer erasure of the memory unit until after additional, non-dummy data (e.g., new user data from a host system) is programmed into any unprogrammed portion of the memory unit that remains. In this way, some embodiments can ensure that a full program/erase cycle is always performed on a memory unit (e.g., block) after a certain number of partial program/erase cycles have been performed on the memory unit. Accordingly, use of various embodiments described herein can reduce or avoid permanent degradation of data retention of a memory device caused by partial program/erase cycles.

As used herein, a memory unit can comprise a block of a memory device, and a memory subunit can comprise a page of a block. For some embodiments, the memory unit and the memory subunit can differ from embodiments described herein.

Disclosed herein are some examples of erasing one or more partially-programmed memory units (e.g., blocks), as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance). Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein. "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a SATA interface, a peripheral component interconnect express (PCIe) interface, universal serial bus (USB) interface, Fibre Channel. Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLCs), can store one bit per cell. Other types of memory cells, such as multi-level cells (MLCs), TLCs, quad-level cells (QLCs), and penta-level cells (PLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

As used herein, a block comprising SLCs can be referred to as a SLC block, a block comprising MLCs can be referred to as a MLC block, a block comprising TLCs can be referred to as a TLC block, and a block comprising QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical memory address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

The memory sub-system controller 115 includes a partially-programmed memory unit eraser 113 that implements monitoring (e.g., tracking) of partial program/erase cycles of a memory unit (e.g., block) and erasure of the memory unit based on the monitoring. According to some embodiments, the partially-programmed memory unit eraser 113 causes the memory sub-system controller 115 to track whether a memory unit of at least one the memory devices 130, 140 is partially programmed (e.g., block has at least some unprogrammed pages) prior to an erase being performed on the memory unit. For instance, the partially-programmed memory unit eraser 113 can cause the memory sub-system controller 115 to detect when erasure of a memory unit is requested (e.g., via a generated or received request). When a request to erase the memory unit is detected, prior to performing the erase, the partially-programmed memory unit eraser 113 can cause the memory sub-system controller 115 to determine whether the memory unit is partially programmed and, if so, set an indicator (e.g., flag) for the memory unit and update (e.g., increment) an erase counter for the memory unit, where the erase counter is meant to maintain a count of when the memory unit is being erased while being partially programmed. Depending on the embodiment, a memory unit is considered partially program when a memory subunit of the memory unit remains unprogrammed (e.g., is not storing valid data). For instance, the memory unit can comprise a block of one of the memory devices 130, 140, the memory subunit can comprise a page or a wordline of that block, and the block is considered partially programmed if at least one of the block's pages or wordlines remain unprogrammed (e.g., wordline remains open). For some embodiments, memory subunits (e.g., pages) of a memory unit (e.g., block) are programmed with data in a sequence, from a first memory subunit to a last memory subunit, and the memory unit (e.g., block) is considered partially programmed until the last memory subunit (e.g., last page) has not been programmed.

For some embodiments, prior to erasure of the memory unit, the partially-programmed memory unit eraser 113 causes the memory sub-system controller 115 to determine whether the erase counter of the memory unit (of one of the memory devices 130, 140) satisfies a condition (e.g., the erase counter surpasses a threshold value). For some embodiments, the erase counter satisfies the condition by a current value of the erase counter surpassing (e.g., being greater than) a threshold value. The threshold value can be a definable value, which can be determined or adjusted (e.g., on the memory sub-system 110) by the host system 120 (e.g., by a user of the host system 120). The threshold value can ensure that a full program/cycle is performed after a certain number of partial program/erase cycles have been performed on the memory unit. Alternatively, the partially-programmed memory unit eraser 113 can cause the memory sub-system controller 115 to determine whether both the indicator and the erase counter of the memory unit satisfy a condition (e.g., the indicator is set and the erase counter surpasses a threshold value). For some embodiments, the erase counter and the indicator satisfy the condition by a current value of the erase counter surpassing (e.g., being greater than) a threshold value and a current value of the indicator indicating that a partial program erase of the memory unit has occurred.

In response to a condition being satisfied (e.g., by the erase counter or by the erase counter and the indicator), the partially-programmed memory unit eraser 113 can cause the memory sub-system controller 115 to permit or cause erasure of the memory until after any remaining, unprogrammed portion of the memory unit (e.g., until the last memory subunit of the memory unit) is programmed with data. For instance, the partially-programmed memory unit eraser 113 can cause the memory sub-system controller 115 to program any unprogrammed portion of the memory unit (e.g., unprogrammed pages or open wordlines of a block) with dummy data prior to erasure of the memory unit. Alternatively, the partially-programmed memory unit eraser 113 can cause the memory sub-system controller 115 to wait until additional, non-dummy data (e.g., new user data from a host system) is programmed to the memory unit and then permit erasure of the memory unit. In this way, the partially-programmed memory unit eraser 113 can cause the memory sub-system controller 115 can defer erasure of the memory unit. In the event that the additional, non-dummy data received is not enough to program the unprogrammed portion of the memory unit that remains, the memory sub-system controller 115 can program the additional, non-dummy data to the memory unit and program any remaining unprogrammed portion with dummy data.

Figure 2:
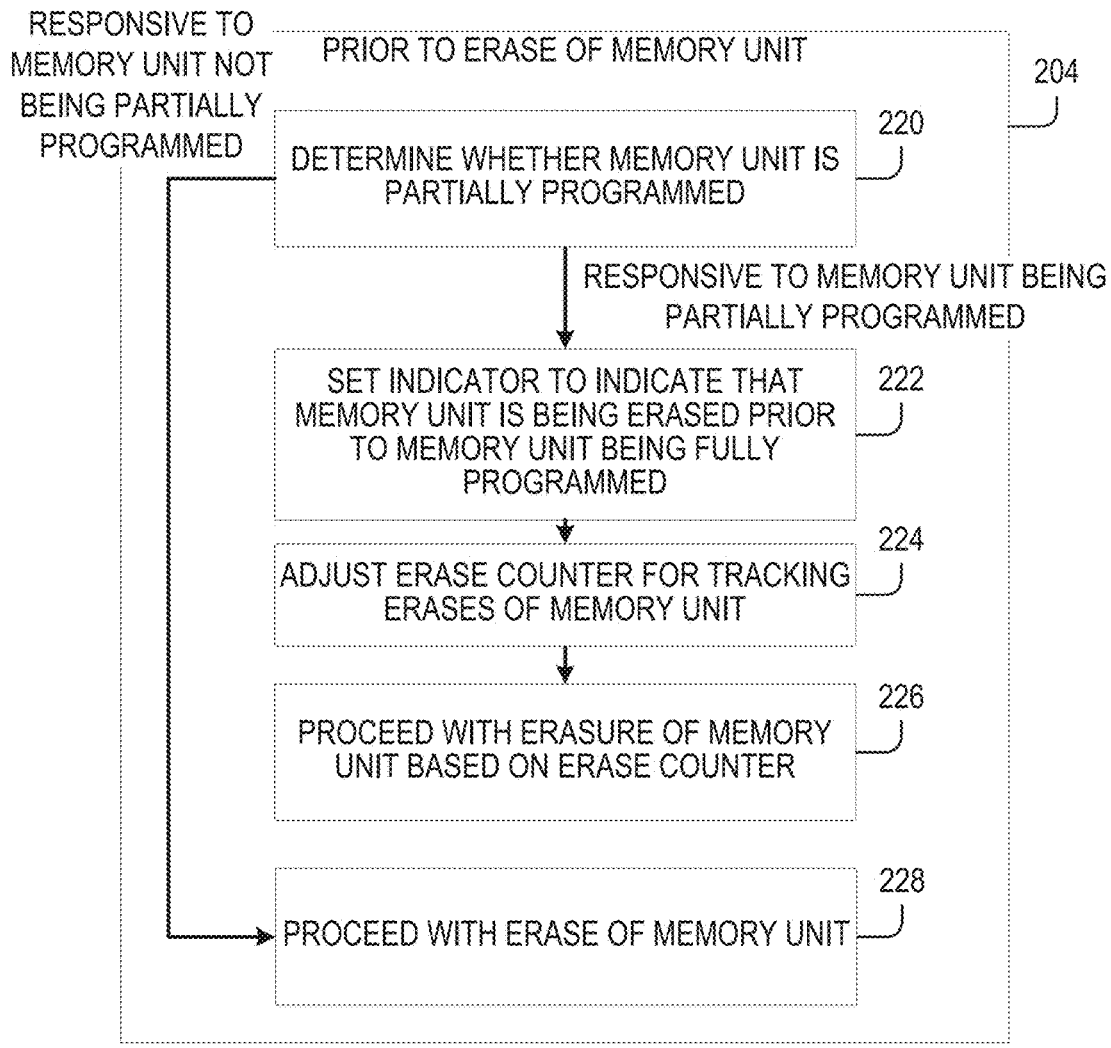
FIGS. 2 through 4 are flow diagrams of example methods for tracking and erasing a partially-programmed memory unit, in accordance with some embodiments of the present disclosure.
Figure 3:
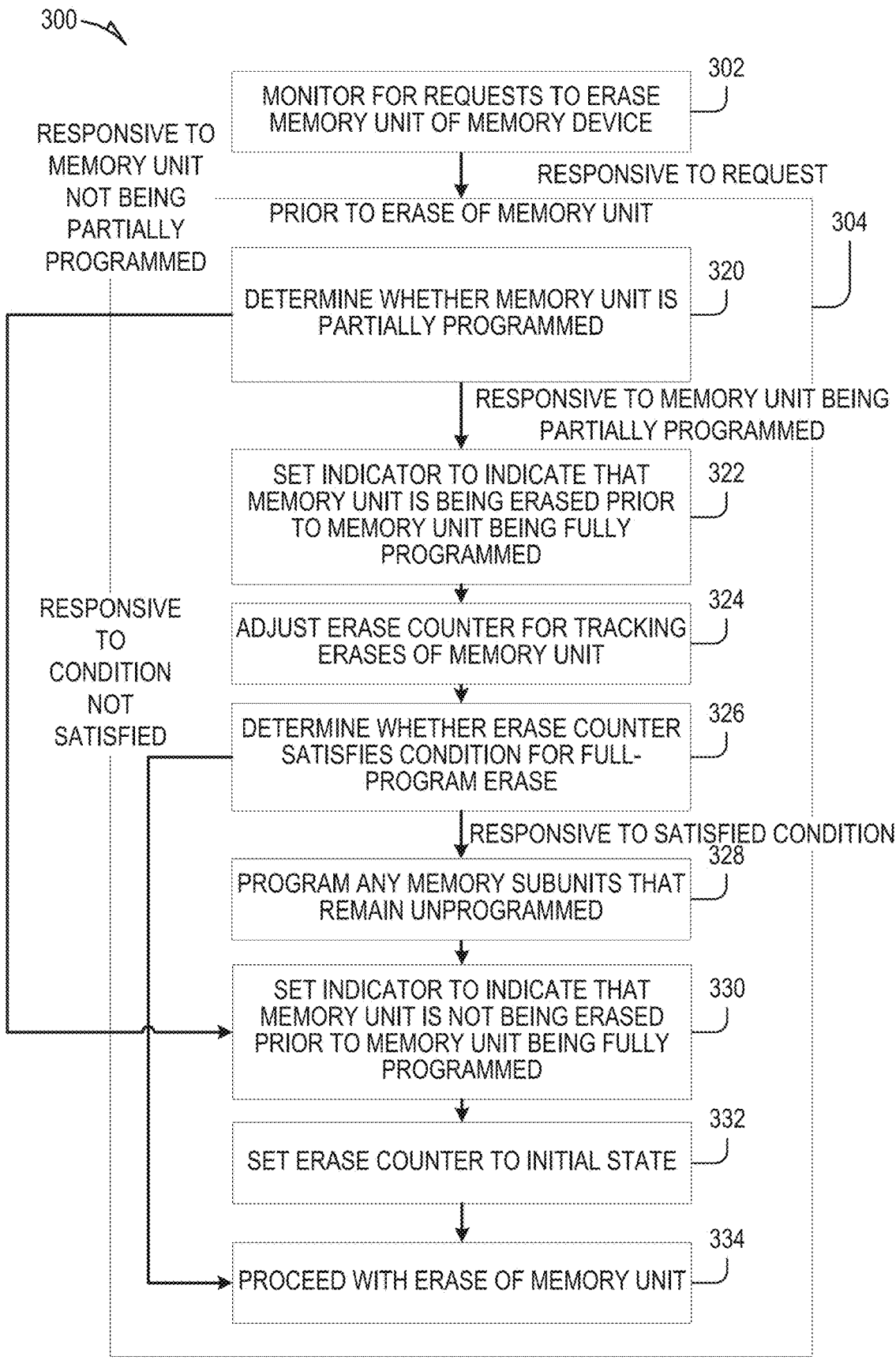
Figure 4:
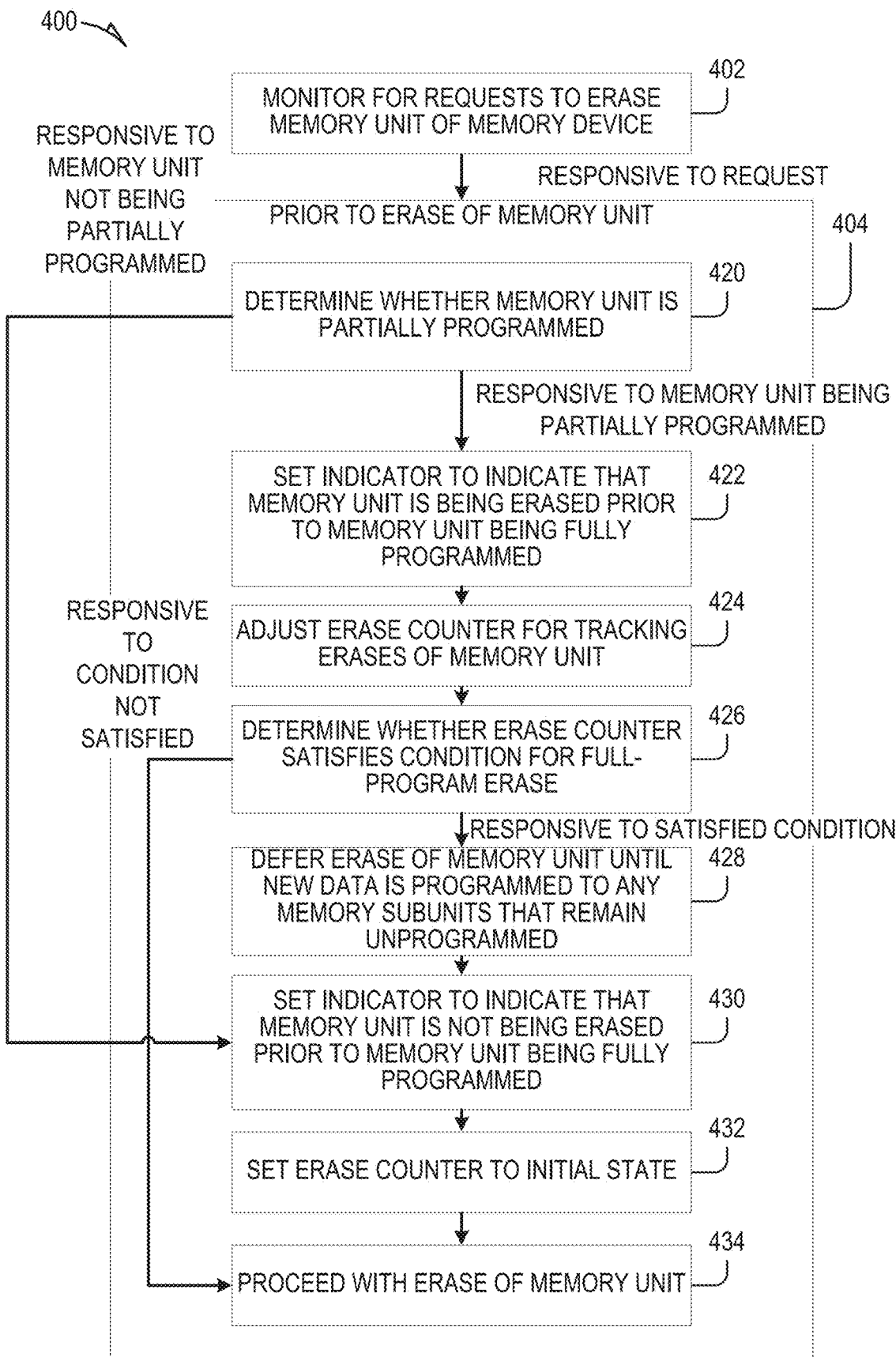

FIGS. 2 through 4 are flow diagrams of example methods for tracking and erasing a partially-programmed memory unit, in accordance with some embodiments of the present disclosure. The methods 200, 300, 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, one or more operations of the methods 200, 300, or 400 are performed by the memory sub-system controller 115 of FIG. 1 based on the partially-programmed memory unit eraser 113. Additionally, or alternatively, for some embodiments, at least one of the methods 200, 300, 400 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Referring now to the method 200 of FIG. 2, the method 200 is performed prior to erasure of a memory unit (e.g., a block) of a memory device (e.g., 140). The memory device can comprise a plurality of memory units, where each memory unit can comprise a plurality of memory subunits. Each memory unit can comprise a block of the memory device, and each memory subunit can comprise a page of a block. Depending on the embodiment, the method 200 can be performed in response to a processing device (e.g., the processor 117 of the memory sub-system controller 115) detecting a request to erase the memory unit, where the request can be generated or received by the processing device (e.g., the processor 117). The detection of the request can be performed as part of the processing device (e.g., the processor 117) monitoring for requests to erase the memory unit.

As illustrated, operation 204 is performed by the processing device (e.g., the processor 117) prior to the memory unit being erased. During operation 204, the processing device (e.g., 117) performs operations 220 through 226. At operation 220, the processing device (e.g., the processor 117) determines whether the memory unit is partially programmed and, if so, the method 200 proceeds to operation 222; otherwise the method 200 proceeds to operation 228. For some embodiments, the processing device (e.g., the processor 117) determines whether the memory unit is partially programmed by determining whether a last memory subunit (e.g., a last page) of the memory unit has been programmed since a last time the memory unit was erased.

The processing device (e.g., 117), at operation 222, sets an indicator of the memory unit to indicate (e.g., via a value representing true) that the memory unit is being erased prior to the memory unit being fully programmed (e.g., the last memory subunit of the memory unit has not been programmed since the memory unit was last erased). The indicator can represent that the memory unit has experienced at least one partial program/erase cycle. For some embodiments, the indicator is stored in metadata for the memory unit (e.g., metadata for the block). The metadata for the memory unit can be stored in the memory unit or, alternatively, stored in one or more certain memory units that are reserved for such purposes (e.g., one or more reserved blocks, which can be used to store system data for the memory device or memory sub-system). For some embodiments, each memory unit of the memory device (e.g., 117) being tracked has its own erase counter. For instance, the memory device can comprise a first memory unit that is tracked with a first erase counter, and a second memory unit that is tracked with a second erase counter.

Subsequently, at operation 224, the processing device (e.g., 117) adjusts an erase counter for the memory unit, where the erase counter is intended to track erases of the memory unit while the memory unit is partially programmed. For some embodiments, the adjustment of the erase counter comprises incrementing the erase counter by a value of one, thereby representing that another request to erase the memory unit, while the memory unit is currently partially programmed, has been detected (e.g., generated or received). As described herein, the erase counter can satisfy the condition by a current value of the erase counter surpassing (e.g., being greater than) a threshold value. Alternatively, depending on the embodiment, the erase counter can be decremented (e.g., where the erase counter is initialized with a max number of partial program/erase cycles, and zero or lower can indicate a condition has been satisfied for a full program/erase cycle). As described herein, the erase counter and the indicator can satisfy the condition by a current value of the erase counter surpassing (e.g., being greater than) a threshold value and a current value of the indicator indicating that a partial-program erase of the memory unit has occurred. For some embodiments, the erase counter is stored in metadata for the memory unit (e.g., metadata for the block). As described herein, the metadata for the memory unit can be stored in the memory unit or, alternatively, stored in one or more reserved memory units. For some embodiments, each memory unit of the memory device (e.g., 117) being tracked has its own indicator. For instance, the memory device can comprise a first memory unit that is tracked with a first indicator, and a second memory unit that is tracked with a second indicator.

At operation 226, the processing device (e.g., 117) proceeds with erasure of the memory unit based on at least the erase counter (e.g., current value of the erase counter) for the memory unit. For example, in response to the erase counter satisfying a condition, at operation 226, the processing device can first fully program the memory unit before proceeding with erasure of the memory unit, thereby erasing the memory unit while the memory unit is fully programmed (e.g., a full-program erase of the memory unit). For some embodiments, the processing device (e.g., 117) proceeds with erasure of the memory unit based on the indicator (e.g., value of the indicator) and the erase counter (e.g., current value of the erase counter) for the memory unit. For instance, in response to the indicator and the erase counter satisfying a condition, at operation 226, the processing device can first fully program the memory unit before proceeding with erasure of the memory unit.

At operation 228, the processing device (e.g., 117) proceeds with erasure of the memory unit. For some embodiments, the erasure by operation 228 represents erasure of the memory unit while the memory unit is already fully programmed (e.g., a full-program erase of the memory unit). Depending on the embodiments, the processing device either directly or indirectly causes erasure of the memory unit. For some embodiments, at operation 228, the processing device (e.g., 117) sets (e.g., resets) the indicator to indicate (e.g., via a value representing false) that the memory unit is being erased while the memory unit is fully programmed (i.e., erased while the memory unit is not partially programmed), and sets (e.g., resets) the erase counter to an initial state (e.g., value of 0, where operation 224 increments).

Referring now to the method 300 of FIG. 3, a processing device (e.g., the processor 117 of the memory sub-system controller 115) monitors for one or more requests to erase of a memory unit (e.g., a block) of a memory device (e.g., 140) at operation 302. In response to detecting a request to erase the memory unit, operation 304 is performed by the processing device (e.g., 117) prior to the memory unit being erased. During operation 304, the processing device (e.g., 117) performs operations 320 through 334 prior to erasure of the memory unit. At operation 320, the processing device (e.g., 117) determines whether the memory unit is partially programmed and, if so, the method 300 proceeds to operation 322, otherwise the method 300 proceeds to operation 334. During operation 334, the processing device (e.g., 117) proceeds with erasure of the memory unit. By continuing from operation 320 to operation 334, the processing device is proceeding with a full-program erase of the memory unit at operation 334.

The processing device (e.g., 117), at operation 322, sets an indicator of the memory unit to indicate (e.g., via a value representing true) that the memory unit is being erased prior to the memory unit being fully programmed (e.g., the last memory subunit of the memory unit has not been programmed since the memory unit was last erased). Thereafter, at operation 324, the processing device (e.g., 117) adjusts (e.g., increments or decrements) an erase counter for the memory unit, where the erase counter is intended to track erases of the memory unit while the memory unit is partially programmed. Operations 320, 322, 324 are respectively similar to operations 220, 222, 224 of the method 200 of FIG. 2.

At operation 326, the processing device (e.g., 117) determines whether the erase counter satisfies a condition for full-program erase of the memory unit (or to permit a partial-program erase of the memory unit). Accordingly, the condition can determine how the requested erasure of the memory unit will proceed. In response to the condition being satisfied (e.g., avoid erasing the memory unit while it is partially programmed), the method 300 proceeds to operation 328; otherwise the method 300 continues to operation 334, where the processing device (e.g., 117) proceeds with erasure of the memory unit. By continuing from operation 326 to operation 334, the processing device is proceeding with a partial-program erase of the memory unit at operation 334. For some embodiments, two different memory units of the memory device (e.g., 117) can have their own, different condition applied at operation 326. For instance, the memory device can comprise a first memory unit and a second memory unit, and a first condition applied to the first memory unit at operation 326 can be different from a second condition applied to the second memory unit at operation 326. Different conditions can be used for different memory units based on the their respective differences. For example, the first and second memory units can comprise different memory cell types (e.g., SLC, MLC, TLC, QLC, etc.) and, accordingly, can have different conditions applied to determine when a full-program/erase cycle is to be performed.

The processing device (e.g., 117), at operation 328, programs any memory subunits of the memory unit that remain unprogrammed with data. In doing so, operation 328 ensures that the memory unit is fully programmed prior to being erased by the memory sub-system. Depending on the embodiment, the data programmed into the remaining memory subunits comprises dummy data (e.g., non-user data). At operation 330, the processing device (e.g., 117) sets (e.g., resets) the indicator to indicate (e.g., via a value representing false) that the memory unit is being erased while the memory unit is fully programmed and, at operation 332, the processing device (e.g., 117) sets (e.g., resets) the erase counter to an initial state (e.g., value of 0, where operation 324 increments).

After operation 332, the method 300 continues to operation 334, where the processing device (e.g., 117) proceeds with erasure of the memory unit. By continuing from operation 332 to operation 334, the processing device is proceeding with a full-program erase of the memory unit at operation 334 (where the memory unit has been fully programmed by operation 328).

Referring now to the method 300 of FIG. 4, the method 400 is similar to the method 300 of FIG. 3, where operations 402, 404, 420, 422, 424, 426, 430, 432, 434 are respectively similar to operations 302, 304, 320, 322, 324, 326, 330, 332, 334. At operation 428, the processing device (e.g., 117) defers erasure of the memory unit until after new data is programmed to any memory subunits of the memory unit that remain unprogrammed, where the new data represents non-dummy data (e.g., new user data from the host system 120). In the event that the new data is not enough to program the unprogrammed portion of the memory unit that remains, the processing device (e.g., 117) can program any portion of the memory unit that remains (after the new data is programmed) with dummy data. By operation 428, the processing device can ensure that a full program/erase cycle is performed on the memory unit (e.g., block) prior to an erasure of the memory unit is performed. As shown, from operation 428, the method 400 proceeds with operations 430, 432, 434.

Figure 5:
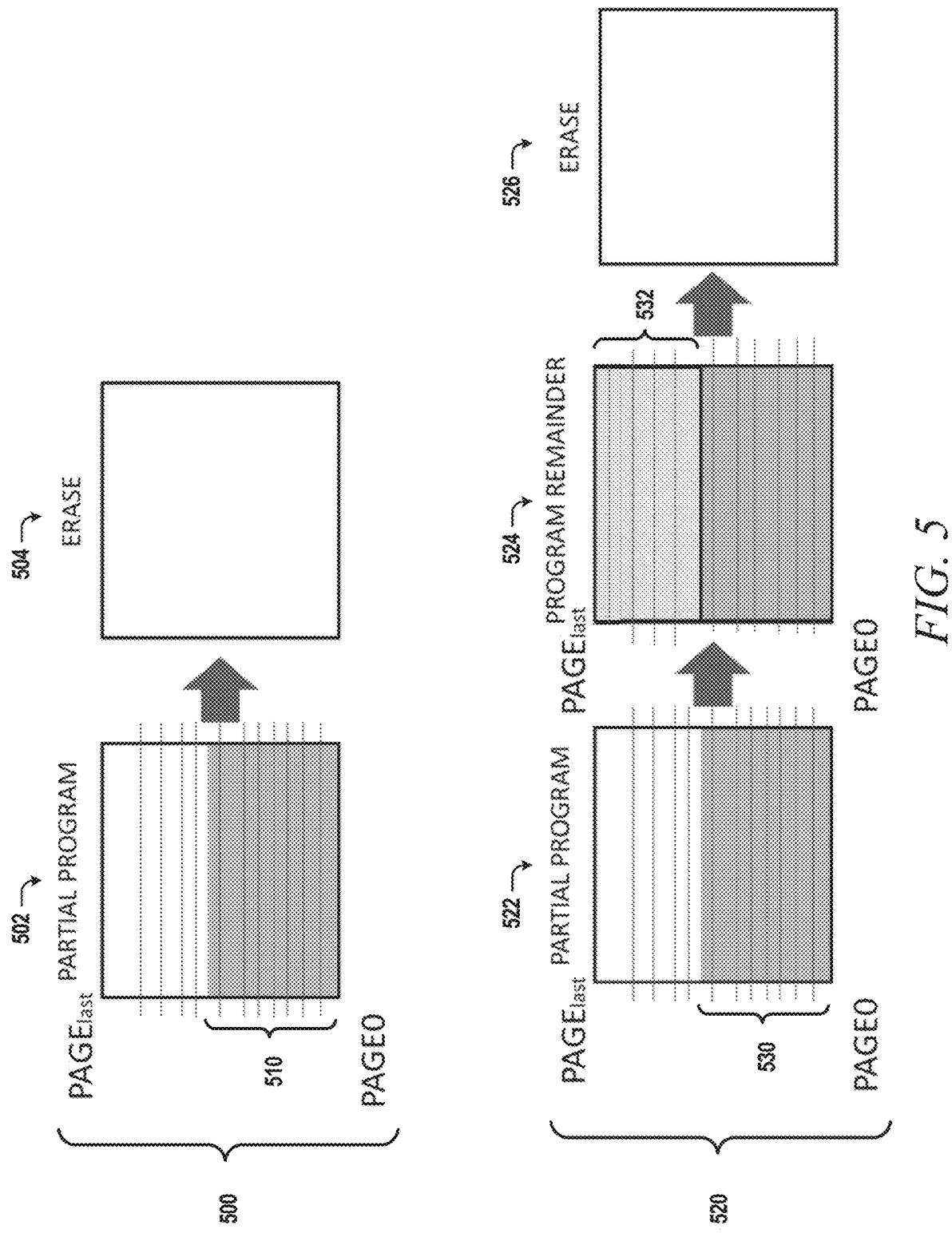
FIG. 5 is a diagram illustrating an example of a partial-program erase of a memory unit and an example of a full-program erase of a memory unit, in accordance with some embodiments of the present disclosure.

FIG. 5 is a diagram illustrating an example 500 of a partial-program erase of a memory unit and an example 520 of a full-program erase of a memory unit, in accordance with some embodiments of the present disclosure. For illustrative purposes, each memory unit in FIG. 5 comprises a block of a memory device, and each block comprises a plurality of pages (PAGE0 through $PAGE_{last}$). With respect to the example 500 of the partial-program erase, the block illustrated at 502 is partially programmed with user data 510. This partially-programmed block is erased, which results in the erased block at 504. With respect to the example 520 of the full-program erase, the block illustrated at 522 is partially programmed with user data 530. In response to a request to erase the block at 522, prior to erasure of the block, the block is programmed with data 532 until the block is fully programmed, as shown at 524. Depending on the embodiment, the data 532 can comprise new data (e.g., new user data received from a host system) or dummy data, or some combination of both. This fully-programmed block is erased, which results in the erased block at 526.

Figure 6A:
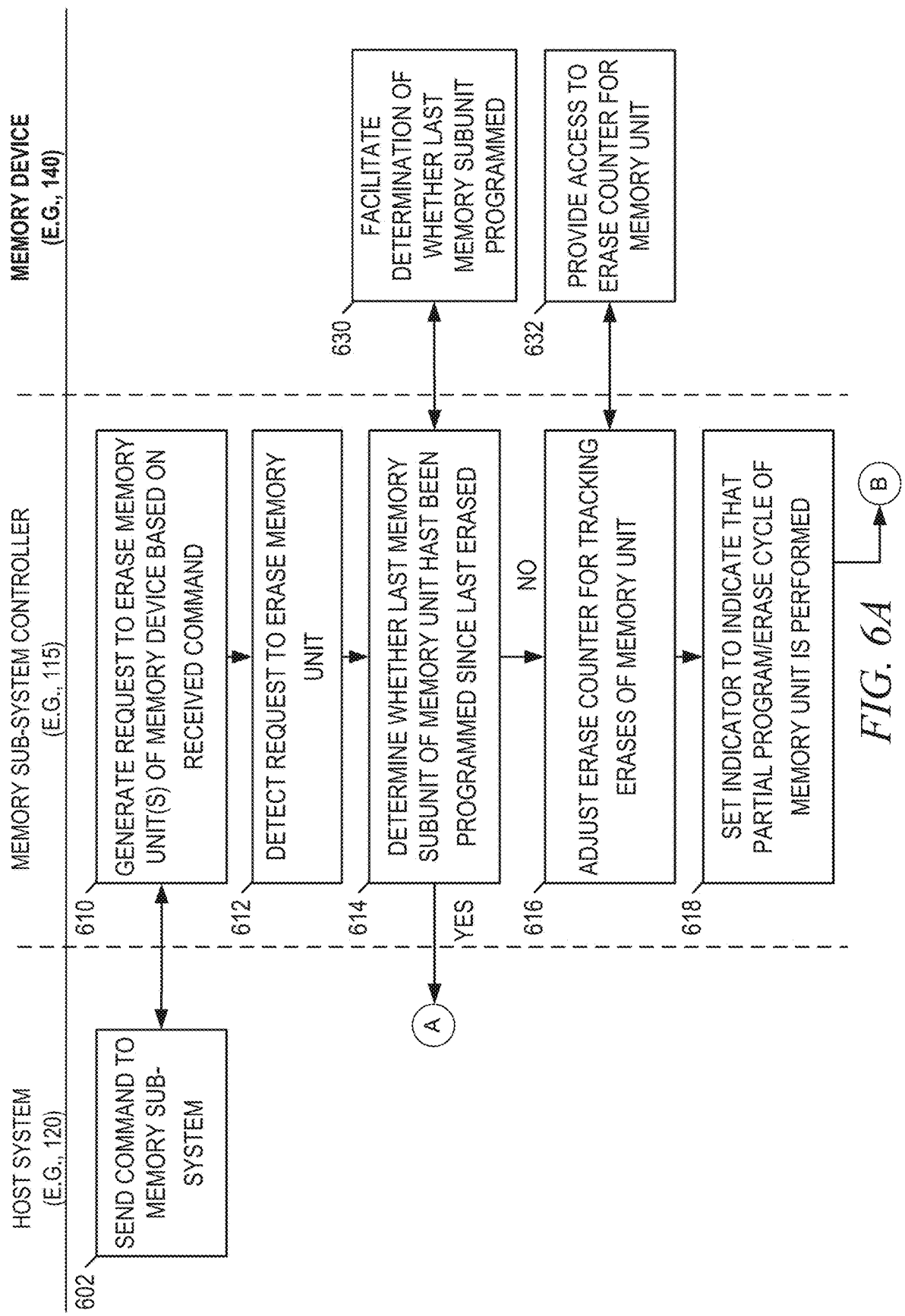
FIGS. 6A and 6B provide an interaction diagram illustrating interactions between components of a computing environment in the context of some embodiments in which a method that tracks and erases a partially-programmed memory unit as described herein is performed.
Figure 6B:
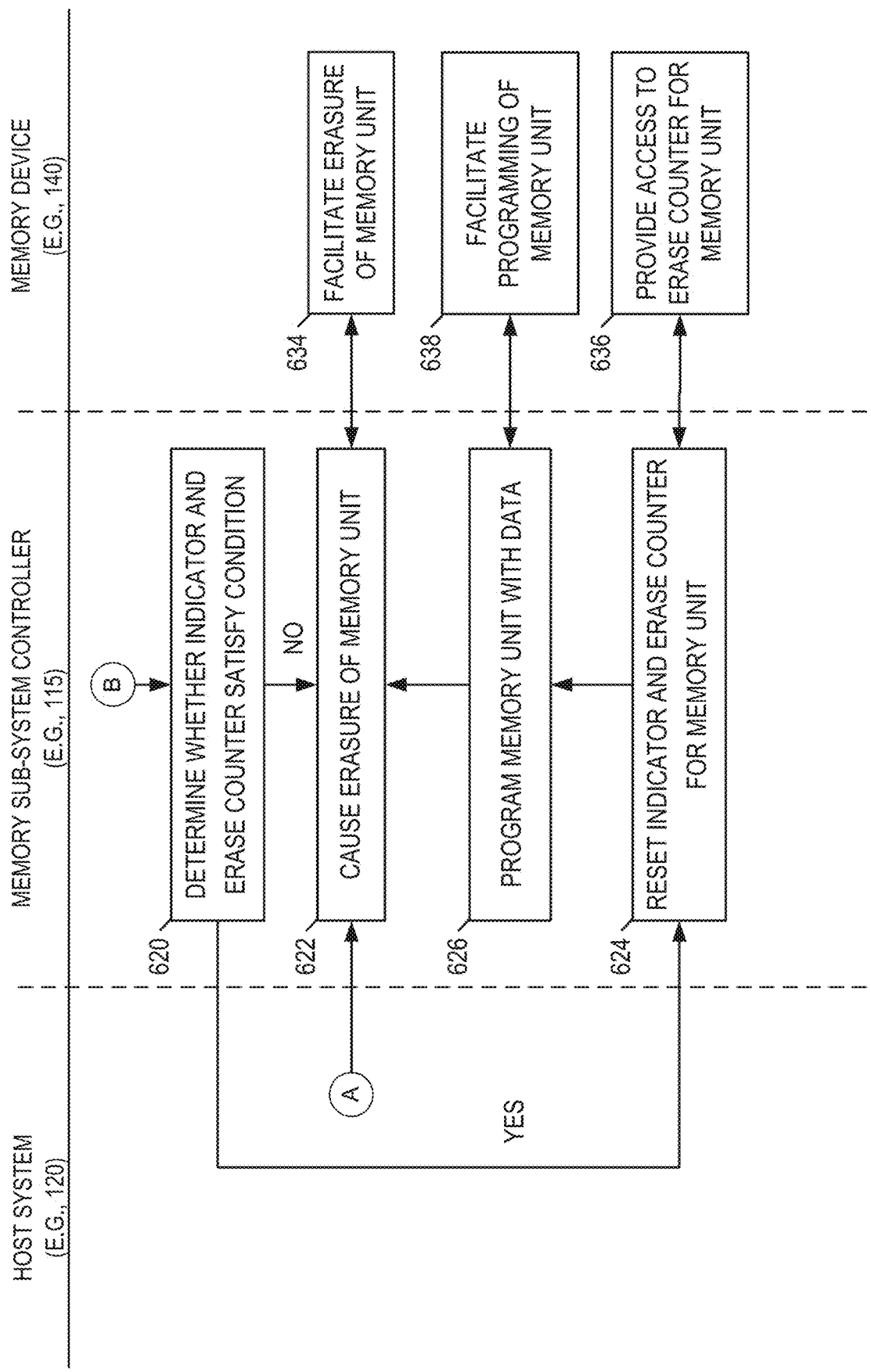

FIGS. 6A and 6B provide an interaction diagram illustrating interactions between components of a computing environment in the context of some embodiments in which a method that tracks and erases a partially-programmed memory unit as described herein is performed.

FIGS. 6A and 6B provide an interaction diagram illustrating interactions between components of a computing environment in the context of some embodiments in which a method that tracks and erases a partially-programmed memory unit as described herein is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., 120), a memory sub-system controller (e.g., 115), a memory device (e.g., 130 or 140), or some combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. In the context of the example illustrated in FIGS. 6A and 6B, the host system can include the host system 120, the memory sub-system controller can include the memory sub-system controller 115, and the memory device can include the memory device 140.

As shown in FIG. 6A, at operation 602, the host system 120 sends, to the memory sub-system 110, a command (e.g., to write data). In response to receiving the command, at operation 610, the memory sub-system controller 115 generates a request to erase one or more memory units of the memory device 140 based on the command. The memory sub-system controller 115 detects, at operation 612, the generated request to erase one of the memory units. Thereafter, at operation 614, the memory sub-system controller 115 determines whether a last memory subunit of the memory has been programmed since it was last erased. As described herein, by operation 614, the memory sub-system controller 115 determines whether the memory unit is partially programmed prior to the memory unit being erased. The memory device 140 facilitates the determination of the program state of the last page at operation 630. In response to determining that the last memory subunit of the memory has been programmed since it was last erased, the memory sub-system controller 115 performs operation 622; otherwise the memory sub-system controller 115 performs operation 616.

At operation 616, the memory sub-system controller 115 adjusts (e.g., increases) an erase counter for tracking erases of the memory unit, where the erase counter is stored on the memory device 140. To facilitate adjustment of the erase counter, the memory device 140 provides the memory sub-system controller 115 with access to the erase counter at operation 632. Additionally, at operation 618, the memory sub-system controller 115 sets an indicator for the memory unit to indicate that a partial program/erase cycle is being performed on the memory unit.

Referring now to FIG. 6B, at operation 620, the memory sub-system controller 115 determines whether the erase counter and indicator satisfy a condition for a full program/erase cycle to be performed on the memory unit. If yes, the memory sub-system controller 115 performs operation 624; otherwise the memory sub-system controller 115 performs operation 622. At operation 622, the memory sub-system controller 115 causes erasure of the memory unit, and the memory device 140 facilitates the erasure at operation 634.

At operation 624, the memory sub-system controller 115 resets the erase counter and indicator for the memory unit. To facilitate this reset, the memory device 140 provides access to at least the erase counter of the memory unit at operation 636. Additionally, at operation 626, the memory sub-system controller 115 programs the memory unit with data (e.g., new data or dummy data), thereby rendering the memory unit fully programmed prior to erasure of the memory unit. The memory device 140 facilitates the programming of the memory unit with data at operation 638. Thereafter, the memory sub-system controller 115 causes the erasure of the memory unit at operation 622.

Figure 7:
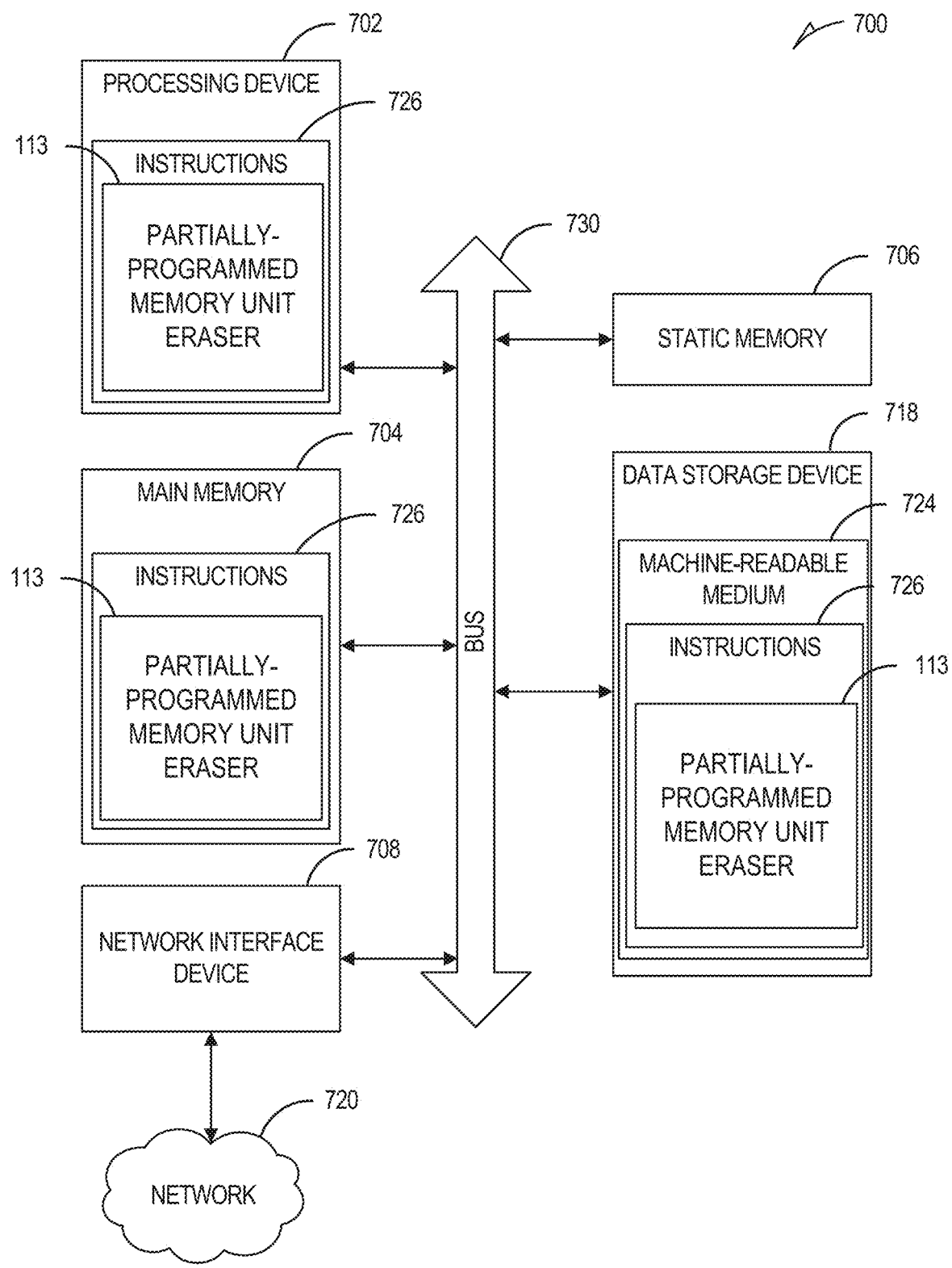
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an application-specific integrated circuit (ASIC), a field programmable gate array (FPGA), a digital signal processor (DSP), a network processor, or the like. The processing device 702 is configured to execute instructions 726 for performing the operations and steps discussed herein. The computer system 700 can further include a network interface device 708 to communicate over a network 720.

The data storage device 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage device 718, and/or main memory 704 can correspond to the memory sub-system 110 of FIG. 1.

In one embodiment, the instructions 726 include instructions to implement functionality corresponding to tracking and erasing a partially-programmed memory unit as described herein (e.g., the partially-programmed memory unit eraser 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled to the memory device, configured to perform operations comprising:
        monitoring for requests to erase a memory unit of the memory device; and
        in response to a request for erasing the memory unit, prior to the memory unit being erased:
            determining whether a last memory subunit of the memory unit has been programmed since a last time the memory unit was erased; and
            in response to determining that the last memory subunit has not been programmed since the last time the memory unit was erased:
                setting an indicator of the memory unit to a representative value that indicates that the memory unit has experienced at least one partial program-erase cycle where the memory unit was last erased prior to the last memory subunit being programmed; and
                incrementing an erase counter that maintains a count of partial program-erase cycles for the memory unit.

2. The system of claim 1, wherein the representative value is a first representative value, and wherein prior to the memory unit being erased in response to the request for erasing the memory unit:
    in response to determining that the last memory subunit has been programmed since the last time the memory unit was erased:
        setting the indicator to a second representative value that indicates that the memory unit has not experienced at least one partial program-erase cycle where the memory unit was last being erased prior to the last memory subunit being programmed; and
        setting the erase counter to an initial state.

3. The system of claim 1, wherein in response to determining that the last memory subunit has been programmed since the last time the memory unit was erased:
    determining whether the erase counter satisfies a condition; and
    in response to the erase counter satisfying the condition:
        programming any memory subunits of the memory unit that remain unprogrammed with dummy data; and
        after the programming of any memory subunits that remain unprogrammed, proceeding with erasure of the memory unit.

4. The system of claim 3, wherein the condition is satisfied when the erase counter surpasses a threshold value.

5. The system of claim 3, wherein in response to determining that the last memory subunit has been programmed since the last time the memory unit was erased:
    in response to the erase counter not satisfying the condition, proceeding with erasure of the memory unit.

6. The system of claim 3, wherein the memory unit is a first memory unit, wherein the erase counter is a first erase counter for the first memory unit, wherein the condition is a first condition for the first memory unit, wherein the memory device comprises a second memory unit, and wherein a second erase counter is maintained for the second memory unit.

7. The system of claim 6, wherein a second condition is used with the second erase counter to determine whether to program any memory subunits of the second memory unit that remain unprogrammed with dummy data prior to erasure of the second memory unit.

8. The system of claim 7, wherein the first memory unit and the second memory unit comprise different memory cell types.

9. The system of claim 1, wherein in response to determining that the last memory subunit has been programmed since the last time the memory unit was erased:
    determining whether the erase counter satisfies a condition; and
    in response to the erase counter satisfying the condition:
    deferring erasure of the memory unit until after any memory subunits of the memory unit that remain unprogrammed are programmed with new data received from a host system.

10. The system of claim 1, wherein the memory unit is a block that comprises a plurality of pages of the memory of the device, and wherein the last memory subunit is a page of the plurality of pages.

11. The system of claim 1, wherein the indicator is stored in metadata for the memory unit.

12. The system of claim 1, wherein the erase counter is stored in metadata for the memory unit.

13. A method comprising:
    monitoring, at a controller of a memory sub-system, for requests to erase a memory unit of the memory sub-system; and
    in response to a request for erasing the memory unit, prior to the memory unit being erased:
        determining, by the controller, whether the memory unit is partially programmed; and
        in response to determining that the memory unit is partially programmed:

setting, by the controller, an indicator of the memory unit to a representative value that indicates that the memory unit has experienced at least one partial program-erase cycle where the memory unit was last erased prior to the memory unit being fully programmed; and incrementing, by the controller, an erase counter that maintains a count of partial program-erase cycles for the memory unit.

14. The method of claim 13, wherein the memory sub-system comprises a memory device, and wherein the memory device comprises the memory unit.

15. The method of claim 14, wherein the memory device comprises the controller.

16. The method of claim 14, wherein the controller is external to the memory device.

17. The method of claim 16, wherein the controller is a memory sub-system controller.

18. The method of claim 13, wherein the indicator is stored in metadata for the memory unit.

19. The method of claim 13, wherein the erase counter is stored in metadata for the memory unit.

20. At least one non-transitory machine-readable storage medium comprising instructions that, when executed by a processing device, cause the processing device to perform operations comprising:

detecting a request to erase a memory unit of a memory device, the memory device being operably coupled to the processing device; and in response to the request, prior to the memory unit being erased:

determining, based on an indicator of the memory unit, whether a last memory subunit of the memory unit has been programmed since a last time the memory unit was erased, the indicator being configured to store a representative value that indicates whether the memory unit has experienced at least one partial program-erase cycle where the memory unit was last erased prior to the last memory subunit being programmed; and in response to determining that the last memory subunit has not been programmed since the last time the memory unit was erased, incrementing an erase counter that maintains a count of partial program-erase cycles for the memory unit.

* * * * *